United States Patent
Lin

[11] Patent Number: 5,946,592
[45] Date of Patent: Aug. 31, 1999

[54] COMBINED IN-SITU HIGH DENSITY PLASMA ENHANCED CHEMICAL VAPOR DEPOSITION (HDPCVD) AND CHEMICAL MECHANICAL POLISHING (CMP) PROCESS TO FORM AN INTERMETAL DIELECTRIC LAYER WITH A STOPPER LAYER EMBEDDED THEREIN

[75] Inventor: Chi-Fa Lin, Hsinchu, Taiwan

[73] Assignee: Winbond Electronics, Corp., Hsinchu, Taiwan

[21] Appl. No.: 09/044,970

[22] Filed: Mar. 19, 1998

[51] Int. Cl.$^6$ .................................................. H01L 21/316
[52] U.S. Cl. .............................................................. 438/633
[58] Field of Search .................................... 438/633, 692; 451/41

[56] References Cited

U.S. PATENT DOCUMENTS 5,494,854  2/1996  Jain .......................................... 437/195

FOREIGN PATENT DOCUMENTS 09223737  8/1997  Japan .

OTHER PUBLICATIONS

Wang, Justin, "Advanced Techniquies for interlayer dielctric depostion and planarization", SPIE vol. 2090 Multilevel Interconnection (1993) pp. 85–92,. 1993.

Primary Examiner—Charles Bowers
Assistant Examiner—Matthew Whipple
Attorney, Agent, or Firm—W. Wayne Liauh

[57] ABSTRACT

A wafer planarization process which utilizes combined high density plasma chemical vapor deposition (HDP-CVD) process and chemical mechanical polishing (CMP) process is disclosed. This process includes the steps of (a) forming a first HDP-CVD layer on the surface of a semiconductor wafer using a first HDP-CVD composition having a higher etching/depositing component ratio and thus a lower CMP removal rate; (b) forming a second HDP-CVD layer on the first HDP-CVD layer using the same HDP-CVD process but with a second HDP-CVD composition having a highest etching/depositing component ratio and thus the lowest CMP removal rate; (c) forming a third HDP-CVD layer on the second HDP-CVD layer using the same HDP-CVD process but with a third HDP-CVD composition having a low etching/depositing component ratio and thus a high CMP removal rate; and (d) using a chemical mechanical process to remove at least a part of the third HDP-CVD layer using the second HDP-CVD layer as a stopper. All the three HDP-CVD compositions contain the same etching and silicon-containing deposition components so as to improve the CMP efficiency without incurring substantially increased fabrication cost.

11 Claims, 3 Drawing Sheets

COMBINED IN-SITU HIGH DENSITY PLASMA ENHANCED CHEMICAL VAPOR DEPOSITION (HDPCVD) AND CHEMICAL MECHANICAL POLISHING (CMP) PROCESS TO FORM AN INTERMETAL DIELECTRIC LAYER WITH A STOPPER LAYER EMBEDDED THEREIN

FIELD OF THE INVENTION

The present invention relates to an improved chemical mechanical polishing (CMP) process which is combined with a high density plasma enhanced chemical vapor deposition (HDP-CVD) process for the fabrication of ultra-large-scale integration (ULSI) devices. More specifically, the present invention relates to a combined "chemical mechanical polishing" and "high density plasma enhanced chemical vapor deposition" (CMP-HDP-CVD) process which involves a CMP stopper sub-layer embedded in an intermetal dielectric (IMD) layer during the planarization of the intermetal (i.e., between successive metal wiring layers) dielectric layer. The intermetal dielectric layer is also called a sacrificial layer, which typically comprises silicon dioxide or silicon nitride, to provide shallow trench isolation, interlayer dielectrics, intermetal dielectrics and other insulation layers and form a planarized surface during the fabrication of trench oxide isolated ULSI circuit devices. The process disclosed in the present invention reduces the required sacrificial layer thickness and the CMP process time, improves the planarization efficiency, and, most importantly, reduces the fabrication cost.

BACKGROUND OF THE INVENTION

In the fabrication of ultra-large-scale integration (ULSI) circuits, vertical stacking, or integration, of a plurality of metal wiring circuits to form multilevel interconnection has become an efficient way to increase circuit performance and increase the functional complexity of the circuits. One drawback of multilevel interconnection is the loss of topological planarity resulting from various photolithographic and etching processes. To alleviate these problems, the wafer is planarized at various stages in the fabrication process to minimize non-planar topography and thus its adverse effects. Such planarization is typically implemented in the dielectric layers.

More recently, chemical-mechanical polishing (CMP) processes have become very well received to planarize the wafer surface in preparation for further device fabrication. The CMP process mainly involves holding a semiconductor wafer against a rotating polishing pad surface wetted by a polishing slurry, which typically comprises an acidic or basic etching solution in combination with alumina or silica particles. On the one hand, the liquid portion of the slurry chemically removes, loosens, or modifies the composition of the material on the wafer which is to be removed. On the other hand, the particle portion of the slurry, in combination of the rotating polishing pad, physically removes the chemical modified material from the wafer. Thus, the name chemical-mechanical polishing was obtained.

One of the main applications of the CMP process is to planarize the intermetal dielectric layer (IMD), or the so-called sacrificial layer, which is typically deposited via a chemical vapor deposition technique on a metal wiring layer to facilitate the fabrication of the next metal wiring layer. The intermetal dielectric layer typically comprises silicon dioxide or silicon nitride to provide shallow trench isolation, interlayer dielectrics, intermetal (i.e., between successive metal wiring layers) dielectrics and other insulation layers.

Due to the topography of the device (i.e, the wiring layer) upon which the sacrificial layer is to be deposited, typically via a chemical vapor deposition (CVD) technique, the thickness of the sacrificial layer has to be very high in order to achieve a satisfactorily planarized surface. On the other hand, the chemical portion (etching) of the CMP process often causes the recessed portions of the IMD layer to be etched (the dishing effect) before the mechanical portion of the CMP process is acting thereupon. This can cause the deviations of the final polished surface of the IMD layer to be even more significant than before polishing. As a result, a CVD composition with low CMP removal rate must be employed to avoid such dishing effect. The use of a low CMP removal rate CVD composition can substantially slow down the CMP processing cost. Thus, it is highly desirable to develop a process which could reduce the required sacrificial layer thickness and the polishing time so as to reduce the CMP/CVD processing time, reduce the overall fabrication cost, and improve the uniformity of the polished device.

U.S. Pat. No. 4,671,970, the content thereof is incorporated herein by reference, discloses a process for creating dielectric material filled trenches of diverse widths between active regions of a semiconductor which comprises the steps of forming a first conformal layer of oxidation barrier over the trenches and the active regions; forming a second conformal layer over the oxidation barrier which comprises a material characterized by its ability to withstand etchants and its subsequent convertability to a dielectric; forming a third conformal layer of a dielectric material; selectively removing dielectric material from the active regions, the narrow width trenches, and the perimeter regions of the wide width trenches; converting the material of the second conformal layer to a dielectric; filling the regions of selectively removed dielectric material with a further dielectric material to above the level above the planar of the active regions; and planarizating the substrate to the level of the active regions.

U.S. Pat. No. 5,395,801, the content thereof is incorporated herein by reference, discloses a semiconductor processing method of providing and planarizing an insulting layer on a semiconductor wafer comprising the steps of: (1) providing a conformal layer of insulating material over a semiconductor wafer; (2) providing a blanketing chemical-mechanical polishing protective layer over the conformal layer; and (3) chemical-mechanical polishing through the outermost surface of the blanketing layer and then through conformal layer in a single chemical-mechanical polishing step using a single chemical-mechanical polishing slurry. The protective layer provides the function of restricting material removal from low topographical areas during such chemical-mechanical polishing. Typically, α-silicon, carbon, boron nitride, undoped $SiO_2$, etc. have been used or suggested for use as the protective material. One of the drawbacks of this process is that, since the material for the protective layer is quite different from that for the main sacrificial layer, the CVD process must be switched to a very different condition. This greatly complicates the fabrication process, introduces contamination concerns, and significantly increases the fabrication cost; it can also raise compatibility problems and may be difficult to be integrated into the standard IC process.

U.S. Pat. No. 5,532,191, the content thereof is incorporated herein by reference, discloses a method for planarization an insulating layer comprising the steps of: (1) forming an insulating film on a substrate by chemical vapor deposition using an organic silicon compound, coating a solution of an insulating substance on the substrate and coating a solution of a precursor of an insulating substance on the substrate; (2) forming a protective film having a chemical mechanical polishing etching speed slower than that of the insulating film by depositing silicon oxide and silicon oxynitride via chemical vapor deposition using an inorganic silicon compound as a raw material; and (3) etching back the insulating film by chemical mechanical polishing using the protective film as an etching stop.

The processes disclosed in the above mentioned references either increased the complexity of the CMP process or did not significant reduce the required CMP processing time. Thus, continued efforts are required to provide possible answers to the problems herein described. These problems are becoming more profound and pressing, as the IC processes are now moving into 0.25 $\mu$m or finer.

SUMMARY OF THE INVENTION

The primary object of the present invention is to develop an improved chemical mechanical polishing process for the fabrication of ULSI devices which involves a stopper sub-layer embedded in the intermetal dielectric layer. More specifically, the primary object of the present invention is to develop an improved chemical mechanical planarization technique, which combines a novel high density plasma enhanced chemical vapor deposition (HDP-CVD) technique with the conventional chemical mechanical polishing (CMP) technique, so as allow a stopper sub-layer to be conveniently embedded in the intermetal dielectric layer to improve the planarization efficiency without incurring substantially increased process complexity, and thus maintaining the associated incremental fabrication cost at a minimum.

In the process disclosed in the present invention, a first dielectric layer, or a first CVD layer, of lower CMP removal rate is deposited on the uneven surface of the wafer via a high density plasma chemical vapor deposition technique. The low CMP removal rate of the first dielectric layer also provides good trench filling capability (i.e, can more effectively fill trenches of smaller width) at a reasonable deposition rate. The first dielectric layer should cover all the uneven surfaces of the wafer to be polished. Then, a relatively thin second dielectric layer, or a second CVD layer, of very low CMP removal rate is deposited on the first dielectric layer to serve as a stopper layer. Finally, a third dielectric layer, or a third CVD layer, of high CMP removal rate is deposited on the stopper or second dielectric layer.

One of the key elements of the present invention is that all the three dielectric layers are formed during the high density plasma enhanced chemical vapor deposition process using the same etching component and the same deposition component, except that they involve different ratios between the etching component and the deposition component. The first dielectric layer of low CMP removal rate is formed with a CVD deposition composition at a high etching/deposition component rate; whereas, the second and third sacrificial layers are formed with a very high and low etching/ deposition component ratios, respectively. It should be noted that the present invention involves the formation of an intermetal dielectric layer, thus, the requirement of having the same "deposition component" typically means having the same "silicon-containing deposition" component. Other co-deposition component can vary for the different dielectric layers. For example, the first and third dielectric layers can be silicon dioxide; whereas, the stopper layer can be silicon dioxide or silicon nitride without substantially increasing the process complexity or introducing concerns about contamination. On the other hand, if the technology advances, the deposition gas may be other than silicon-containing gas. For example, the dielectric layer can be boron nitride (BN). In that case, the deposition component will be a boron-containing gas.

In the present invention, because a dielectric layer of very low CMP removal rate is provided not too distantly above the wafer surface as a CMP stopper layer, the recessed areas, or trenches, within the chip are protected and the dishing effect is minimized during the CMP process. As the CMP process begins, the relatively small area with high topography will face an initially higher down force and will be removed at a favorably higher rate. As the CMP process progresses, the effective CMP contact area increases and the removal rate per unit area will also decrease. However, the use of a high CMP removal rate sacrificial layer as the third dielectric layer helps improving the overall removal rate. Near the end of the CMP process, the thin layer of very low CMP removal rate is exposed which serves as a CMP stopper to prevent over polishing. The increased effective contact area resulting from the use of the high CMP removal rate sacrificial dielectric layer, combined with the use of the thin CMP stop layer, greatly reduces the required thickness of the overall intermetal dielectric layer while improving the overall CMP efficiency and the degree of planarization.

The process disclosed in the present invention can be summarized as comprising the following steps:

(a) Selecting a pair of an etching component and a silicon-containing deposition component such that a higher ratio of the etching component over the silicon-containing depositing component will result in a lower removal rate by a subsequent CMP process of a CVD layer deposited from the silicon-containing deposition component on a substrate via a HDP-CVD process;

(b) Forming a first HDP-CVD layer on the substrate via a HDP-CVD process using a first HDP-CVD composition containing the etching component and the silicon-containing deposition component at a first ratio;

(c) Forming a second HDP-CVD layer on the first HDP-CVD layer using a second HDP-CVD composition process containing the etching component and the silicon-containing deposition component at a second ratio;

(c) Forming a third HDP-CVD layer on the second HDP-CVD layer using a third CVD composition process containing the etching component and the silicon-containing deposition component at a third ratio; and (d) Using a chemical mechanical process to remove at least a part of the third HDP-CVD layer using the second HDP-CVD layer as a stopper;

(e) Wherein the first HDP-CVD composition has a higher etching/silicon-containing deposition component ratio, and thus a lower CMP removal rate, than the third HDP-CVD composition, and the second HDP-CVD composition has a higher etching/silicon-containing deposition component ratio, and thus also a lower CMP removal rate, than the first HDP-CVD composition.

As discussed above, one of the main advantages of the present invention is that all the three dielectric layers including the stopper layer (i.e., the second HDP-CVD layer) contain the same etching and deposition components, except that the ratios between the etching gas and the depositing gas are adjusted from low, very low, to high. Thus, the same deposition components can be used for all three layers; this advantage eliminates the need for extra process cost. In the present invention, the stopper layer is also called the first sacrificial layer, because it contains the same composition as the second, or main, sacrificial layer. In a preferred embodiment, the etching component is argon and the deposition component is silane, $SiH_4$, and the dielectric layers so formed are silicon dioxide or silicon nitride layers. It should be noted that in the present invention, the term "deposition gas" narrowly means silicon-contain deposition gas. Other deposition gas or gases (such as oxygen- or nitrogen containing gases) which will constitute a part of the dielectric layer may be introduced and varied during the CVD process; it is the silicon-containing deposition gas that should be kept the same. Other deposition gases will be called co-deposition gases. The change in the HDP-CVD composition may require an adjustment in the RF power to achieve the intended results.

By using a very slow CMP removal rate dielectric layer as a stop layer upon a dielectric layer of low CMP provides a better trench, or gap, filling capability of the CVD process at a reasonable filling rate (result of the first dielectric layer), while allowing an improved and more uniform overall CMP remove rate to be maintained over the entire wafer (result of the stopper layer). All these benefits are obtained with little or no requirement in the modification of the fabrication equipment while reducing the fabrication time and reducing the manufacturing cost.

In summary, the present invention utilizes a very novel approach which forms the stop layer and the sandwiching dielectric layers using the same etching/deposition components but at different ratios. This approach requires little or no additional process cost, poses no contamination concerns, involves very few additional process steps or material matching problems, and can be effortlessly integrated into any standard IC process.

BRIEF DESCRIPTION OF THE DRAWING

The present invention will be described in detail with reference to the drawing showing the preferred embodiment of the present invention, wherein.

DETAILED DESCRIPTION OF THE PREFERRED EMBODIMENT

Figure 1:
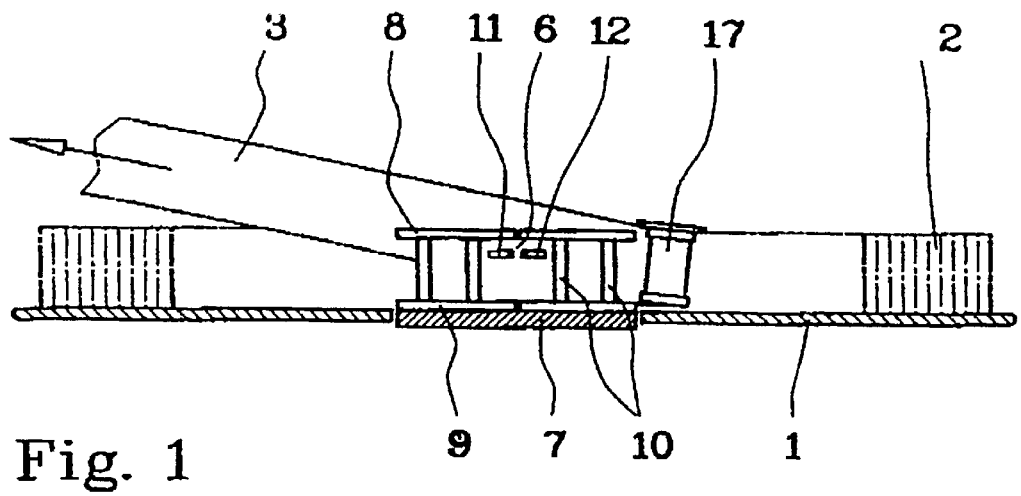
FIG. 1 contains illustrative plots of CMP removal rate and trenching filling capability (in terms of the smallest gap that can be filled under normal conditions) vs. the ratio of etching gas and deposition gas.

The present invention discloses an improved chemical mechanical polishing process for the planarization of the wafer surface during the fabrication of ULSI devices involving a stopper layer. In the process disclosed in the present invention, a first dielectric layer of low CMP removal rate is deposited on the uneven surface of the wafer via a high density plasma chemical vapor deposition technique. The low CMP removal rate of the first dielectric layer also provides better trench filling capability which can more effectively fill trenches of smaller width. Thereafter, a second dielectric layer, or a stopper layer, of very low CMP removal rate is deposited on the first dielectric layer. Finally, a third dielectric layer of high CMP removal rate is deposited on the stopper layer. In the present invention, all the three dielectric layers including the stop layer all comprise the same composition except that their etching/deposition component ratios are different. Different dielectric layers may contain different co-deposition components in that the stopper layer may be silicon nitride whereas the sandwiching dielectric layers may be silicon dioxide, or vice verse.

The process disclosed in the present invention, which combines a novel high density plasma chemical vapor depostion (HDP-CVD) process with a conventional chemical mechanical polishing (CMP) process can be summarized as comprising the following steps:

(a) Selecting a pair of an etching component and a deposition component such that a low ratio of the etching component over the depositing component will result in a higher removal rate, and a high ratio of the etching component over the depositing component will result in a lower removal rate, during a subsequent CMP process;

(b) forming a first dielectric layer, or a first HDP-CVD layer, on a substrate via a HDP-CVD process using a first HDP-CVD composition having a high etching/depositing component ratio and thus a low CMP removal rate;

(c) forming a second dielectric layer, or a second HDP-CVD layer, on the first dielectric layer using the same HDP-CVD process but with a second HDP-CVD composition having a very high etching/depositing component ratio and thus a very low CMP removal rate; and (d) forming a third dielectric layer, or a third HDP-CVD layer, on the second dielectric layer using the same HDP-CVD process but with a third HDP-CVD composition having a low etching/depositing component ratio and thus a high CMP removal rate; and (e) using a chemical mechanical process to remove at least a part of the third HDP-CVD layer using the second HDP-CVD layer as a stopper.

In the present invention, because a dielectric layer of very low CMP removal rate is provided above the wafer surface as a stopper layer, the recessed areas, or trenches, within the chip that have been filled with the first dielectric layer are protected and the dishing effect is minimized during the initial stage of the CMP polishing process. At the beginning of the CMP process, the relatively small area with high topography will be subject to an initially higher down force and will be removed at a favorably higher rate. As the CMP process progresses, the effective CMP contact area increases and the removal rate per unit area will decrease. However, the use of a high CMP removal rate dielectric layer as the main sacrificial layer helps maintaining the overall removal rate at a relatively high level. Near the end of the CMP process, a portion of the second dielectric layer is exposed which serves as a CMP stopper to prevent over polishing. The increased effective contact area resulting the use of the high CMP removal rate first dielectric layer combined with the use of the CMP stop layer greatly improves the overall CMP efficiency and the degree of planarization.

In a preferred embodiment, the etching gas during the chemical vapor deposition process is argon and the deposition gas is SiH$_4$, and the sacrificial layers so formed are silicon dioxide or silicon nitride layers. One of the main advantages of the present invention is that all the thre dielectric layers including the stopper layer contain the same components, except that their etching/deposition components ratios are different, and that they may contain different co-deposition components such as oxygen or nitrogen containing components. This greatly minimizes the need for any increased manufacturing cost, which usually accompanies any improvement in quality.

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

FIG. 1 contains illustrative plots of CMP removal rate, shown as curve A, and trenching filling capability (in terms of the smallest gap that can be filled under normal conditions), shown as curve B, vs. the ratio of etching gas (Ar) and deposition gas (SiH$_4$) for a preferred embodiment of the HDP-CVD composition selected for the present invention. As shown in FIG. 1, as the ratio of etching gas/deposition gas increases, the CMP removal rate decreases. So does the gap size, or gap spacing, that can be filled (smaller gap size indicating more efficient gap filling capability).

Figure 2:
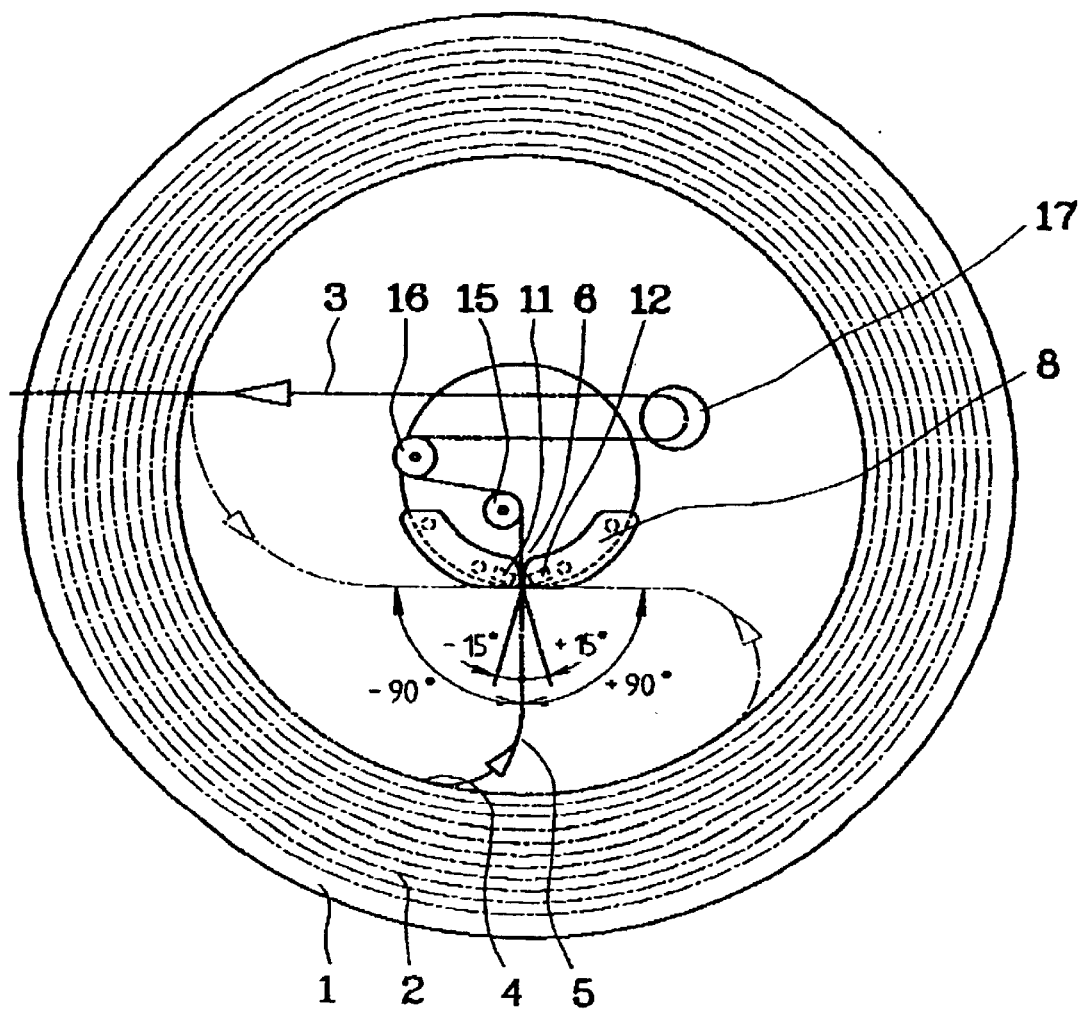
FIG. 2 is a schematic diagram showing the first step of a preferred embodiment of the process of the present invention in which a HDP-CVD composition with a high etching/depositing component ratio is deposited on the wafer surface via a HDP-CVD technique to form a first dielectric layer.

FIG. 2 is a schematic diagram showing the first step of a preferred embodiment of the process of the present invention in which a HDP-CVD composition with a high etching/depositing component ratio was deposited on the wafer surface via a HDP-CVD technique to form a first dielectric layer 3, which covers the metal wiring 1 and fills the gaps 2.

Figure 3:
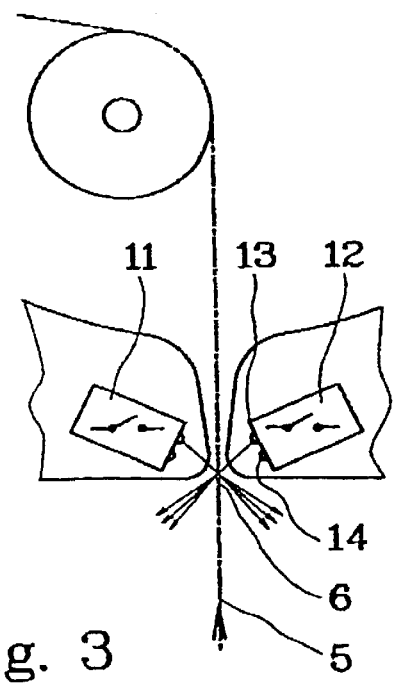
FIG. 3 is a schematic diagram showing that a HDP-CVD composition with a very high etching/depositing component ratio is deposited on the first dielectric layer via the same HDP-CVD technique to form a stopper layer.

FIG. 3 is a schematic diagram showing that a thin HDP-CVD composition with a very high etching/depositing component ratio was deposited on the first dielectric layer 3 via the same HDP-CVD technique to form a second dielectric layer, or stopper layer, 4.

Figure 4:
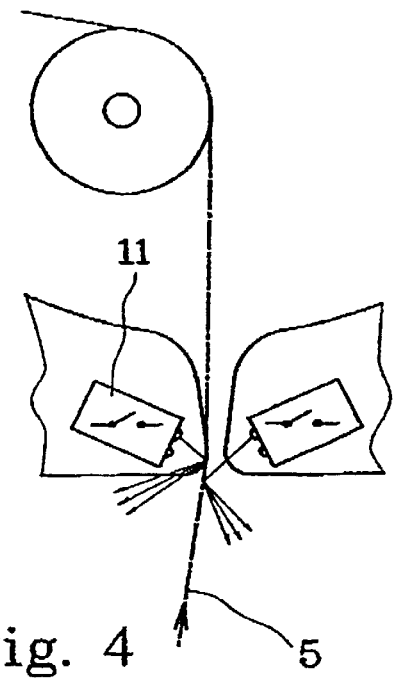
FIG. 4 is a schematic diagram showing that a HDP-CVD composition with a low etching/depositing component ratio is deposited on the stopper layer via the same HDP-CVD technique to form a third dielectric layer, or a sacrificial layer.

FIG. 4 is a schematic diagram showing that another HDP-CVD composition with a low etching/depositing component ratio was deposited on the stopper layer 4 via the same HDP-CVD technique to form a third dielectric layer, or the sacrificial layer, 5.

Figure 5:
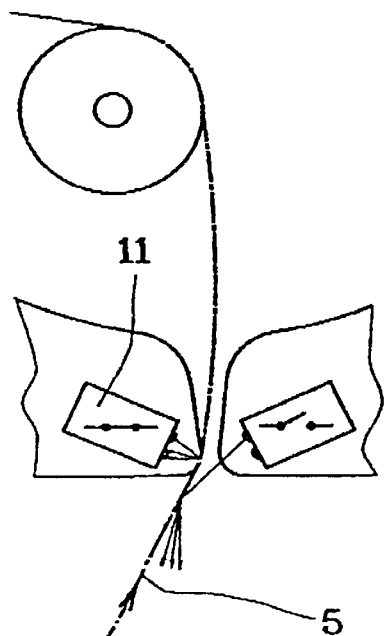
FIG. 5 is a schematic diagram showing that a relatively higher polishing force is acting on the small area of the first dielectric layer with high topography during the initial stage of the CMP process.

FIG. 5 is a schematic diagram showing that a relatively higher polishing force, shown as vertical arrows, was acting on the small areas of the sacrificial 5 with high topography during the initial stage of the CMP process.

Figure 6:
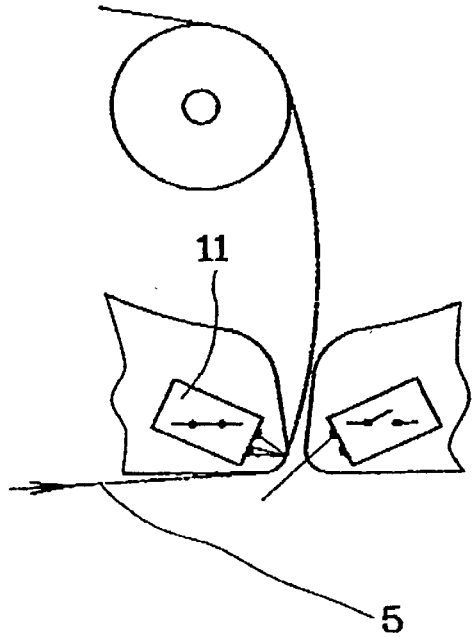
FIG. 6 is a schematic diagram showing that, as the CMP process progresses, a relatively uniform polishing force is acting on the entire area of the first dielectric layer.

FIG. 6 is a schematic diagram showing that, as the CMP process progressed, a relatively uniform polishing force was acting on the entire area of the sacrificial layer 5.

Figure 7:
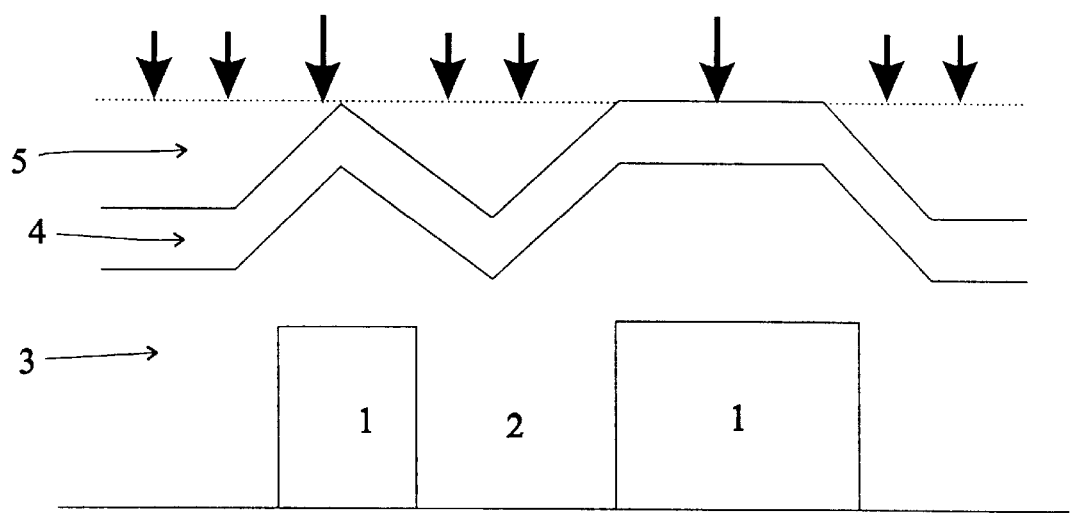
FIG. 7 is a schematic diagram showing that how the stop layer works at the end of the CMP process.
Figure 1:
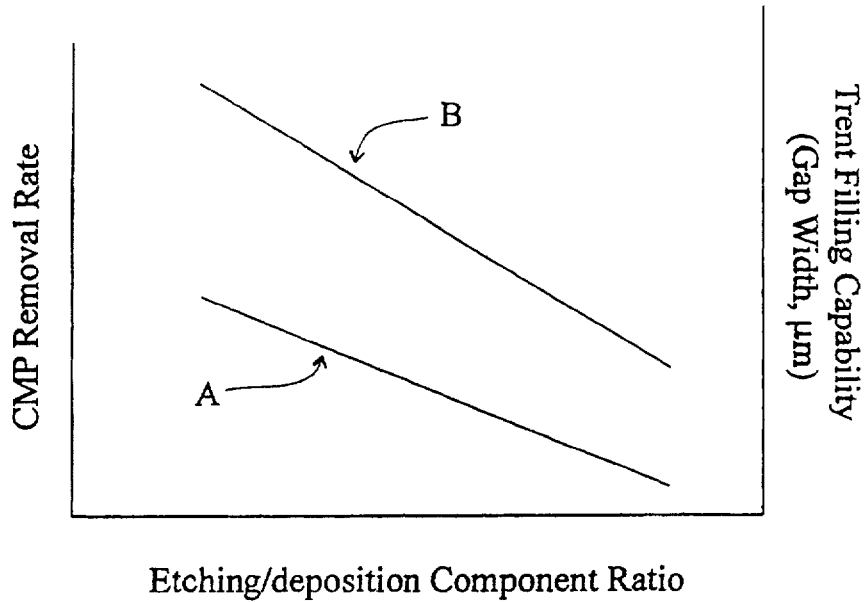
Figure 2:
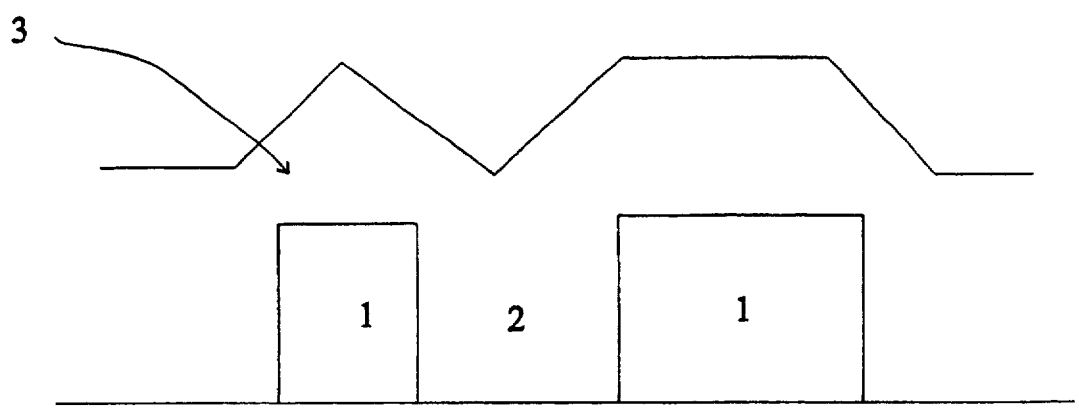
Figure 3:
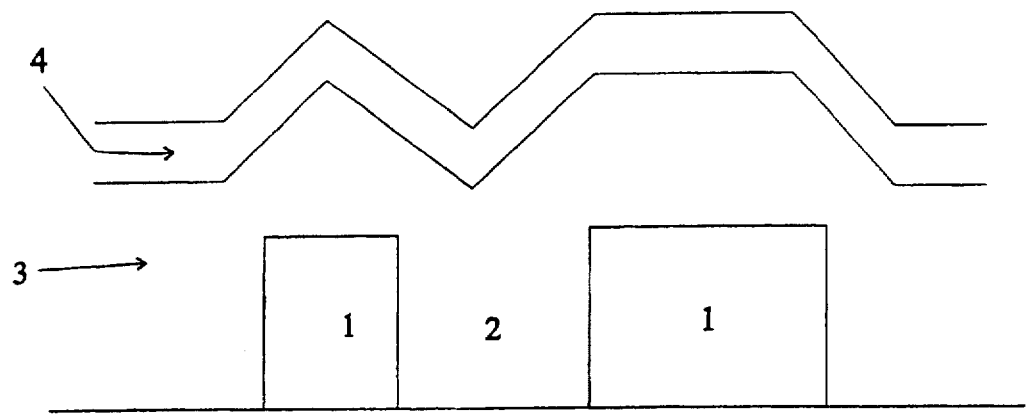
Figure 4:
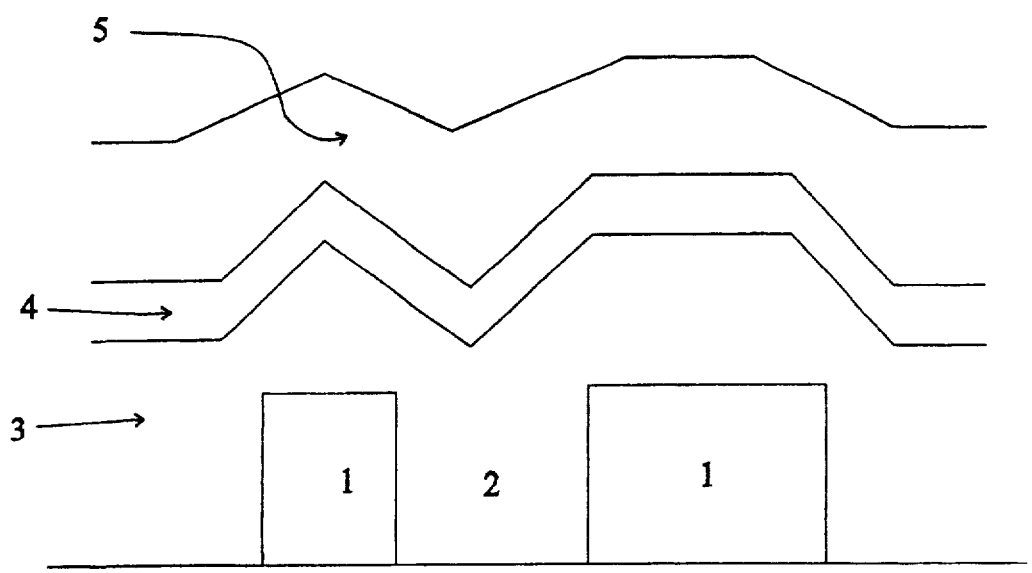
Figure 3:
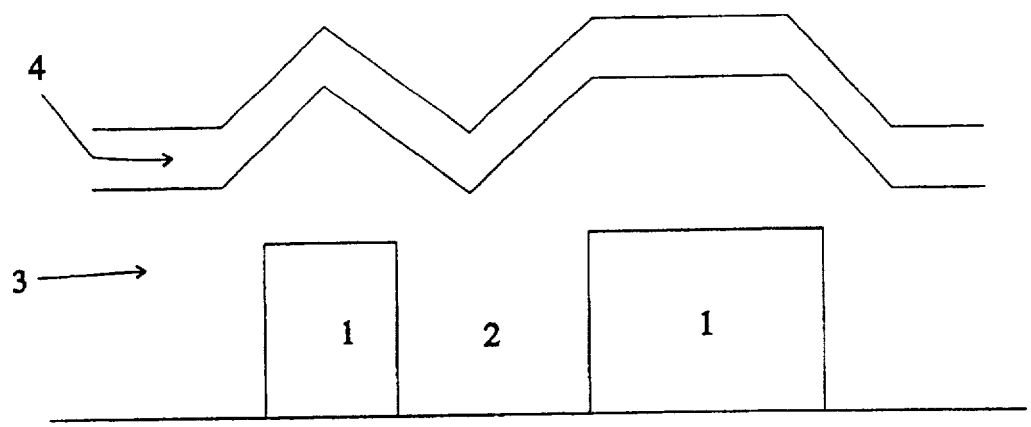
Figure 4:
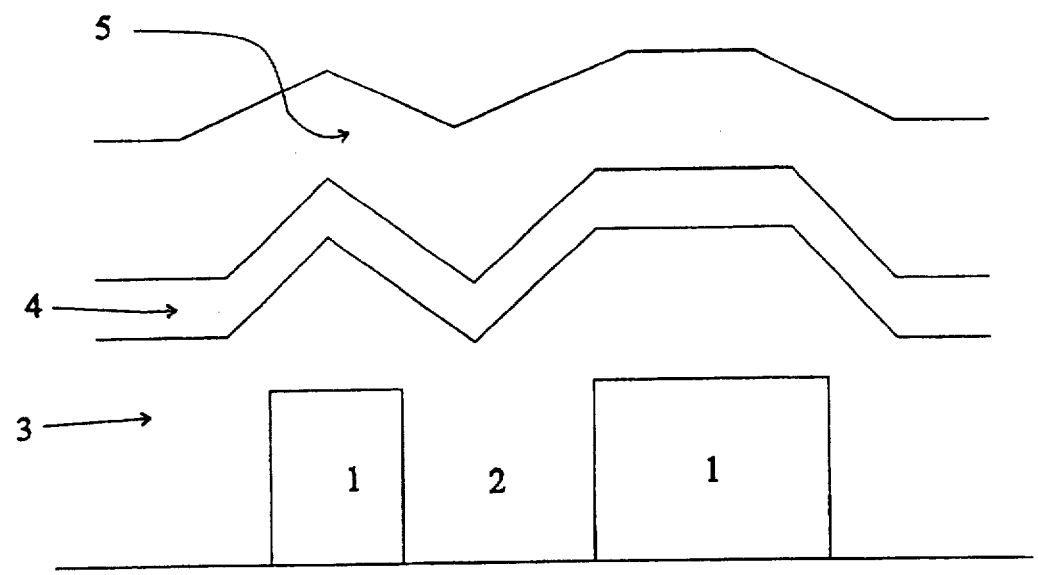
Figure 7:
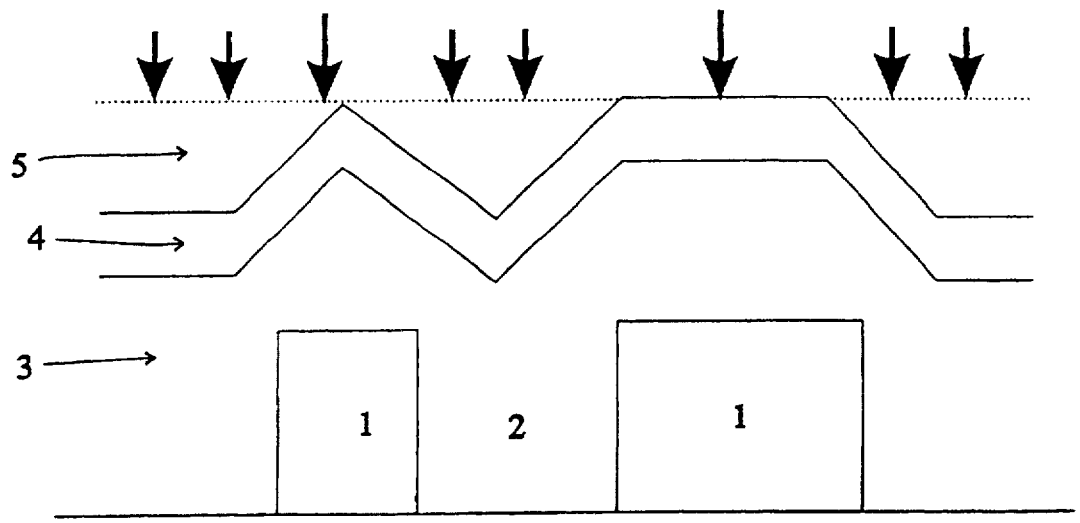

FIG. 7 is a schematic diagram showing that how the stop layer 6 works at the end of the CMP process.

As discussed above, the process disclosed in the present invention utilizes the same etching and deposition gases to form both the stop layer and the sacrificial layer, the only difference being that the ratio of etching/deposition components is changed from a high value for the first dielectric layer to very high for the stop layer, finally to a low value for the sacrificial layer. The present invention allows the thickness of the sacrificial layer and the CMP polishing time to be minimized while greatly improving the efficiency of planarization at the same or even reduced cost.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

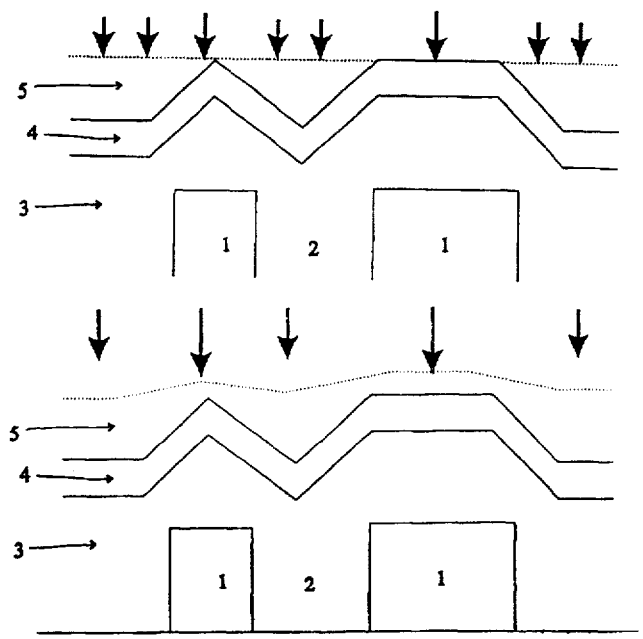

What is claimed is:

1. A wafer planarization process for planarizing a semiconductor wafer surface by combining a high density plasma chemical vapor deposition (HDP-CVD) process with a chemical mechanical polishing (CMP) process, said process comprising the steps of:

(a) selecting a general HDP-CVD composition containing a predetermined etching component and a predetermined deposition component, wherein said etching component and said deposition component are selected such that a higher etching/deposition component ratio will generally result in a slower removal rate by a subsequent CMP process of an HDP-CVD layer after said HDP-CVD layer is deposited on a substrate from said deposition component with a co-deposition component, and a low etching/deposition component ratio will generally result in a faster removal rate;

(b) forming a first HDP-CVD layer on the substrate via an HDP-CVD process using a first HDP-CVD composition, which contains said etching component and said deposition component having a first etching/depositing component ratio;

(c) forming a second HDP-CVD layer on the first HDP-CVD layer using a second HDP-CVD composition, wherein said second HDP-CVD composition contains said etching component and said deposition component at a second etching/depositing component ratio;

(d) forming a third HDP-CVD layer on the second HDP-CVD layer using a third HDP-CVD composition, wherein said third HDP-CVD composition contains said etching component and said deposition component at a third etching/depositing component ratio;

(e) using a chemical mechanical process to remove at least a part of said third HDP-CVD layer using said second HDP-CVD layer as a stopper;

(f) further wherein said second etching/depositing component ratio >said first etching/depositing component ratio >said third etching/depositing component ratio.

2. The wafer planarization process according to claim 1 wherein said etching component is Ar as said deposition component is SiH$_4$.

3. The wafer planarization process according to claim 1 wherein said pair of etching/deposition components are selected such that a high etching/deposition component ratio will also result in a more efficient gap filling capability of said HDP-CVD composition.

4. The wafer planarization process according to claim 1 wherein said co-deposition component is a nitrogen- or oxygen-containing component during the preparation of all said three HDP-CVD layers.

5. The wafer planarization process according to claim 1 wherein said co-deposition component is an oxygen-containing during the preparation of said first and third HDP-CVD layer, and said co-deposition component is a nitrogen-containing component during the preparation of said second HDP-CVD layer.

6. A wafer planarization process for planarizing a semiconductor wafer surface comprising the steps of:

(a) forming a dielectric layer on the wafer surface via a chemical vapor deposition process;

(b) forming a stopper layer on said dielectric layer using the same chemical vapor deposition process; and (c) forming a sacrificial layer on said stopper dielectric layer using the same chemical vapor deposition process; and (d) using a chemical mechanical polishing process to remove at least a part of said sacrificial layer using said stopper layer as a stopper;

(e) wherein said dielectric layer, said stop layer, and said sacrificial layer are formed during said chemical vapor deposition process using a deposition composition having the same etching and deposition components but with different etching/deposition component ratios such that said stop layer has a slowest removal rate when subject to said chemical mechanical polishing process relative to said dielectric layer and said sacrificial layer, and said sacrificial layer has a higher removal rate than said dielectric layer.

7. The wafer planarization process according to claim 6 wherein said deposition composition also contains an oxygen-containing or nitrogen-containing co-deposition component to form a silicon oxide layer or a silicon nitride layer, respectively by said chemical vapor deposition process.

8. The wafer planarization process according to claim 6 wherein said chemical vapor deposition process is a high density plasma enhanced chemical vapor deposition process.

9. The wafer planarization process according to claim 6 wherein said etching component is argon and said deposition component is $SiH_4$.

10. The wafer planarization process according to claim 6 wherein said etching component and said deposition component are selected such that said dielectric layer has a better gap filling capability than said sacrificial layer.

11. The wafer planarization process according to claim 6 wherein said etching component and said deposition component are selected such that said dielectric layer is formed during said chemical vapor deposition process using a higher ratio of etching/deposition components than said sacrificial layer, and said stopper layer is formed using an ever higher ratio of etching/deposition components than said dielectric layer.

* * * * *

UNITED STATES PATENT AND TRADEMARK OFFICE
CERTIFICATE OF CORRECTION

PATENT NO. : 5,946,592
DATED : August 31, 1999
INVENTOR(S) : Chi-Fa Lin

It is certified that error appears in the above-identified patent and that said Letters Patent is hereby corrected as shown below:

The title page should be deleted and substitute therefor the attached title page.

Drawings:

Delete Drawing FIGS. 1-7, and substitute therefor the Drawing Sheets, consisting of FIGS. 1-7, as shown on the attached pages.

Signed and Sealed this

Twenty-eighth Day of August, 2001

*Attest:*

Nicholas P. Godici

*Attesting Officer*

NICHOLAS P. GODICI
*Acting Director of the United States Patent and Trademark Office*

United States Patent [19]
Lin

[11] Patent Number: 5,946,592
[45] Date of Patent: Aug. 31, 1999

[54] COMBINED IN-SITU HIGH DENSITY PLASMA ENHANCED CHEMICAL VAPOR DEPOSITION (HDPCVD) AND CHEMICAL MECHANICAL POLISHING (CMP) PROCESS TO FORM AN INTERMETAL DIELECTRIC LAYER WITH A STOPPER LAYER EMBEDDED THEREIN

[75] Inventor: Chi-Fa Lin, Hsinchu, Taiwan

[73] Assignee: Winbond Electronics, Corp., Hsinchu, Taiwan

[21] Appl. No.: 09/044,970

[22] Filed: Mar. 19, 1998

[51] Int. Cl.$^6$ ............................................ H01L 21/316
[52] U.S. Cl. ................................................. 438/633
[58] Field of Search ................................ 438/633, 692; 451/41

[56] References Cited

U.S. PATENT DOCUMENTS 5,494,854  2/1996  Jain ............................................ 437/195

FOREIGN PATENT DOCUMENTS 09223737  8/1997  Japan.

OTHER PUBLICATIONS

Wang, Justin, "Advanced Techniques for interlayer dielctric depostion and planarization", SPIE vol. 2090 Multilevel Interconnection (1993) pp. 85–92, 1993.

Primary Examiner—Charles Bowers
Assistant Examiner—Matthew Whipple
Attorney, Agent, or Firm—W. Wayne Liauh

[57] ABSTRACT

A wafer planarization process which utilizes combined high density plasma chemical vapor deposition (HDP-CVD) process and chemical mechanical polishing (CMP) process is disclosed. This process includes the steps of (a) forming a first HDP-CVD layer on the surface of a semiconductor wafer using a first HDP-CVD composition having a higher etching/depositing component ratio and thus a lower CMP removal rate; (b) forming a second HDP-CVD layer on the first HDP-CVD layer using the same HDP-CVD process but with a second HDP-CVD composition having a highest etching/depositing component ratio and thus the lowest CMP removal rate; (c) forming a third HDP-CVD layer on the second HDP-CVD layer using the same HDP-CVD process but with a third HDP-CVD composition having a low etching/depositing component ratio and thus a high CMP removal rate; and (d) using a chemical mechanical process to remove at least a part of the third HDP-CVD layer using the second HDP-CVD layer as a stopper. All the three HDP-CVD compositions contain the same etching and silicon-containing deposition components so as to improve the CMP efficiency without incurring substantially increased fabrication cost.

11 Claims, 3 Drawing Sheets